(12) United States Patent  
Tang

(10) Patent No.: US 6,711,053 B1  
(45) Date of Patent: Mar. 23, 2004

(54) SCALEABLE HIGH PERFORMANCE MAGNETIC RANDOM ACCESS MEMORY CELL AND ARRAY

(75) Inventor: Denny Tang, Saratoga, CA (US)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 9 days.

(21) Appl. No.: 10/353,583

(22) Filed: Jan. 29, 2003

(51) Int. Cl.$^7$ ............................................... G11C 11/00
(52) U.S. Cl. ........................ 365/158; 365/171; 365/173
(58) Field of Search ................................ 365/158, 171, 365/173, 209, 189.01

(56) References Cited

U.S. PATENT DOCUMENTS

| | | | | |
|---|---|---|---|---|
| 5,699,293 A | * | 12/1997 | Tehrani et al. | 365/158 |
| 5,978,257 A | * | 11/1999 | Zhu et al. | 365/173 |
| 6,269,018 B1 | * | 7/2001 | Monsma et al. | 365/145 |
| 6,331,943 B1 | * | 12/2001 | Naji et al. | 365/158 |
| 6,424,562 B1 | * | 7/2002 | Rosner et al. | 365/158 |
| 6,479,848 B2 | * | 11/2002 | Park et al. | 257/295 |
| 6,532,163 B2 | * | 3/2003 | Okazawa | 365/97 |
| 6,573,586 B2 | * | 6/2003 | Sakata et al. | 257/529 |
| 6,606,262 B2 | * | 8/2003 | Perner | 365/158 |

* cited by examiner

*Primary Examiner*—Anh Phung  
(74) *Attorney, Agent, or Firm*—George O. Saile; Stephen B. Ackerman; Billy Knowles

(57) ABSTRACT

An MRAM array has groupings of MRAM cells that are interconnected by word control lines, bit lines, primary program control lines, and secondary program control lines. Each MRAM cell is comprised of a magnetic tunnel junction and a primary switching device connected between the magnetic tunnel junction and one of the primary program control lines to provide the write current through the pinned layer of the magnetic tunnel junction. In a first embodiment, the pinned ferromagnetic layer is connected directly to a segmented local program control line that eliminates parasitic currents during read or write of an MRAM cell. In a second embodiment, the MRAM cell includes a secondary switching device connected between the second side of the ferromagnetic layer the local program control line. The secondary program control lines are segmented to eliminate parasitic currents during a read or write of an MRAM cell.

26 Claims, 4 Drawing Sheets

SCALEABLE HIGH PERFORMANCE MAGNETIC RANDOM ACCESS MEMORY CELL AND ARRAY

BACKGROUND OF THE INVENTION

1. Field of the Invention

This invention relates generally to memory cells, array structures for memory cells, and methods for writing and reading the memory cells. More particularly, this invention relates to magnetic random access memory (MRAM) cells, array structures for MRAM cells, and methods for writing and reading MRAM cells.

2. Description of Related Art

Magneto-electronic memories are emerging as important memory technologies. Presently, there are three types of magnetic memory devices that are grouped according to the physics of their operation. These categories are a hybrid ferromagnetic semiconductor structure, a metal spin transistor or spin valve, and a tunnel magnetic junction. Writing to memories of each of the devices is essentially the same in that the direction of a magnetic field determines the state of the digital data stored in a memory cell. Reading of each of the devices is different for each of the devices. The ferromagnetic semiconductor device essentially employs a Hall Effect to determine the state of the digital data stored in the memory cell. The metal spin transistor and the magnetic tunnel junction each employ a change in magneto-resistance to determine a state of the digital data stored in the memory cell. In a metal spin transistor, the relative resistance difference is on the order of from 6% to 8%. The discrimination of the state of the digital data is difficult with the metal spin transistor. However, the magnetic tunnel junction has a resistance difference on the order of 12%.

U.S. Pat. No. 6,269,018 (Monsma, et al.), U.S. Pat. No. 5,978,257 (Zhu, et al.) and U.S. Pat. No. 5,699,293 (Tehrani, et al.) illustrate the structure of magnetic tunnel junction devices as used for memory cells. The magnetic tunnel junction is a tri-layer structure in which two ferromagnetic layers are separated by a nonmagnetic tunnel barrier. One of the ferromagnetic layers has a fixed magnetic field and the other ferromagnetic layer is connected to have its magnetic orientation modified dependent upon the current flowing through the layer. If the magnetic fields of the two ferromagnetic layers are parallel, the magnetic junction has a lower resistance than if the fields are anti-parallel. This difference in resistance allows the sensing of the digital data being stored in the magnetic tunnel junction.

Tehrani, et al. demonstrates a method of operating a random access memory device constructed from a MRAM device. The MRAM device has a group of pairs of memory cells, a column decoder, a row decoder, and a comparator. The pair of memory cells is designated by column decoder and row decoder (32) in response to a memory address. Complementary bits ("0" and "1") are stored in the pair of memory cells. When the state in the pair of memory cell is read, both bits in the pair of memory cells are compared to produce an output at one read cycle time to a bit line.

Zhu, et al. describes a MRAM cell having two magnetic layers with an insulating layer sandwiched between. Conductive layers are connected to each of the magnetic layers. A word line is adjacent to or in contact with, the cell so as to provide a magnetic field to partially switch magnetic vectors along the length of the first magnetic layer. Information is stored by passing one current through the word line and a second current through the two conductive layers sufficient to switch vectors in the two magnetic layers. Sensing is accomplished by passing a read current through a word line sufficient to switch one layer (and not the other) and a sense current through the cell, by way of the two conductive layers, and measuring a resistance across the cell.

Monsma, et al. illustrates a MRAM using current through MTJ write mechanism. Each memory cell of the memory includes a magnetic tunnel junction device having two free ferromagnetic layers and a highly conductive layer formed between the first ferromagnetic layer and the second ferromagnetic layer of the magnetic tunnel junction device. A write current through each selected memory cell flows into the highly conductive layer and along at least a portion of the highly conductive layer. A self-field associated with the write current changes a first predetermined magnetization of the first and second ferromagnetic layers to a second predetermined magnetization. A second embodiment of the memory cell includes a magnetic tunnel junction device having a free ferromagnetic layer, a pinned ferromagnetic layer, and a tunneling barrier layer formed between the free and pinned ferromagnetic layers. The free ferromagnetic layer has a magnetization in a form of a vortex. The pinned ferromagnetic layer has substantially the same shape as the shape of the free ferromagnetic layer and a magnetization in a form of a vortex. A write current flows through the memory cell and producing a self-field that changes a magnetic vortex state of the free ferromagnetic layer from one orientation to a second orientation.

U.S. Pat. No. 6,331,943 (Naji, et al.) describes a magnetic tunnel junction random access memory architecture in which an array of memory cells is arranged in rows and columns. Each memory cell includes a magnetic tunnel junction and a control transistor connected in parallel. A control line is connected to the gate of each control transistor in a row of control transistors and a metal programming line extending adjacent to each magnetic tunnel junction is connected to the control line in spaced apart intervals by vias. Further, groups of memory cells in each column are connected in series to form local bit lines which are connected in parallel to global bit lines. The series-parallel configuration is read using a centrally located column to provide a reference signal and data from columns on each side of the reference column is compared to the reference signal or two columns in proximity are differentially compared.

SUMMARY OF THE INVENTION

An object of this invention is to provide a MRAM cell for the storage, retention, and recovery of digital data.

Another object of this invention is to provide a MRAM array for the storage, retention, and recovery of digital data.

Further, another object of this invention is to provide a method for operating a MRAM cell.

To accomplish at least one of these objects and other objects, a MRAM array has groupings of MRAM cells. The MRAM cells are interconnected by word control lines to provide a control signal for accessing the memory structure.

The grouping of MRAM cells are organized into a memory structure, each memory structure has at least one local program control line to provide a program current for writing a digital data bit within the memory structure. The MRAM cells of the memory structure are arranged in rows and columns. The each column of MRAM cells is connected to one local program control line and each row of MRAM cells is connected to a word control line. Each MRAM cell is comprised of a magnetic tunnel junction and a primary switching device. One terminal of the primary switching device is connected to one of the primary program control lines to provide the write current to magnetic tunnel junction. A control terminal of the primary switching device is connected to one of the word control lines. The word control line selectively activates the primary switching device to permit the write current to flow to the magnetic tunnel junction when the word control line is set to a select state. When the word control line is set to the deselect state the write current is prevented from flowing to the magnetic tunnel junction.

The write current flows through a pinned ferromagnetic layer of the magnetic tunnel junction to store the state of the digital data to the MRAM cell. The direction of the write current flow determining a magnetic field of the pinned ferromagnetic layer. The current flow being between the primary program control line and local program control line.

In a first embodiment, the a second terminal of the primary switching device is connected to one side of the pinned ferromagnetic layer such that when activated the write current flows from or to the primary program control line. A second, opposite side of the pinned ferromagnetic layer is connected directly to the local program control line.

In a second embodiment, the pinned ferromagnetic layer is connected to the primary switching device at the first side. The MRAM cell further includes a secondary switching device having a first terminal connected at a second side of the pinned ferromagnetic layer. A second terminal of the secondary switching device is connected to the local program control line such that the write current flows between the first side and second side of the pinned ferromagnetic layer. The secondary switching device has a control terminal connected to the word control line to selectively activate the secondary switching device to allow the write current to flow between the primary program control line and the secondary program control line through the pinned ferromagnetic layer.

The memory array includes at least one bit line such that each bit line is connected to the columns of the MRAM cells at a free ferromagnetic layer of the magnetic tunnel junction. The free ferromagnetic layer is connected to receive a sense current from one of the bit lines, the sense current determining a data value as stored in the magnetic tunnel junction. In the first embodiment, the bit line is disconnected to be floating during the writing of the digital data. Alternately, in the second embodiment, the bit line is set to a voltage level equal to the voltage level of the primary program control line during the writing of the digital data.

The operation of the MRAM cell begins by writing digital data to the MRAM cell. The writing of the digital data includes activating the write current source to a direction of the write current to a direction representing the digital data. The primary switching device is activated by setting to the word control line to a select state to permit the write current to flow to the MRAM cell. When the MRAM cell has received and retained the digital data, the primary switching device is deactivated by setting the word control line to deselect state.

The operation continues by reading the MRAM cell by activating a sense current source to place the sense current on the bit line. The digital data is then determined from the sense current as a function of the magnetoresistance of the magnetic tunnel junction.

In the first embodiment of the MRAM cell, the writing digital data to the MRAM cell is accomplished by discon-necting the bit line such that the bit line is floating during the writing of the digital data. Alternately, in the second embodiment, the writing digital data to the MRAM cell is accomplished by setting the bit line to a voltage level equal to the voltage level of the primary program control line during the writing of the digital data.

The pinned ferromagnetic layer is connected to the primary switching device at a first side of the pinned ferromagnetic layer and connected to a secondary program control line at a second side such that the write current flows between the first side and second side.

Further, in the second embodiment, the writing digital data to the MRAM cell further includes activating the secondary switching device by setting to the word control line to a select state to permit the write current to flow between the primary program control line and the secondary program control line through the pinned ferromagnetic layer.

DETAILED DESCRIPTION OF THE INVENTION

Figure 1A:
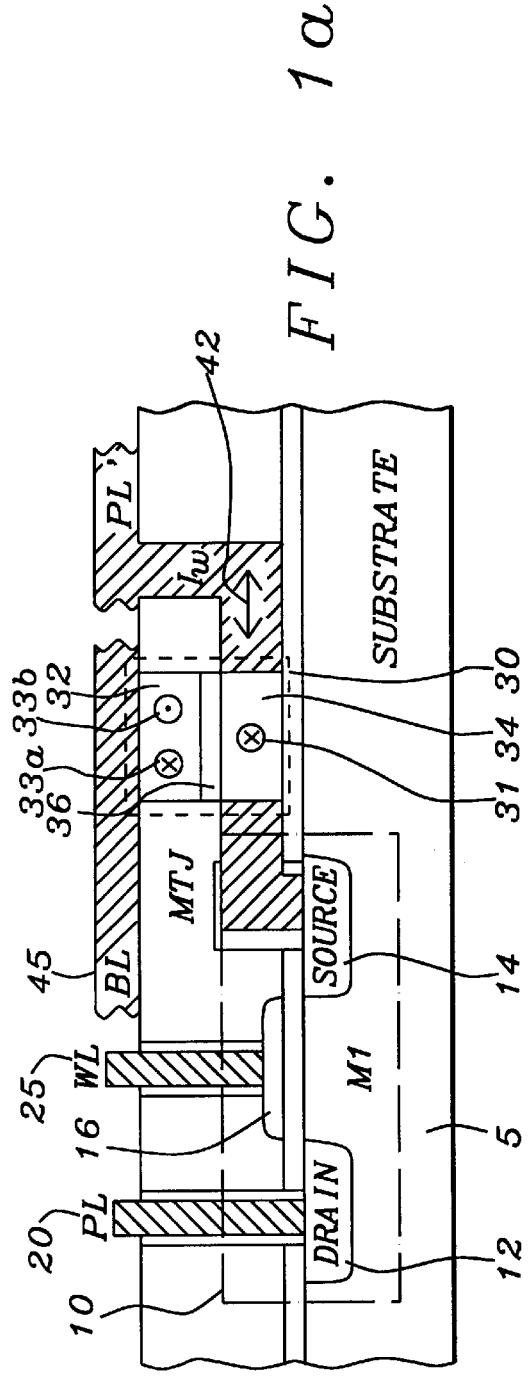
FIGS. 1a and 1b are cross-sectional views of a first and second embodiment of a substrate having magnetic random access memory cell of this invention.

In the first embodiment of this invention, as shown in FIG. 1a, the MRAM cell is formed at the surface of a substrate 5. A magnetic tunnel junction 30 is formed on the surface of the substrate 5. The magnetic tunnel junction is formed by sandwiching a tunnel barrier 36 between two ferromagnetic layers 32 and 34. The ferromagnetic layer 32 being termed the free ferromagnetic layer and is connected directly to the bit line 45. It is used to store or retain the digital data as a function of the orientation 33a and 33b of the magnetization of free layer. The ferromagnetic layer 34 is termed the pinned layer. The magnetization 31 of this pinned layer is pinned; for example, by an anti-ferromagnetic layer or other means.

One side of the pinned ferromagnetic layer 34 of the magnetic tunnel junction device 30 is connected to the source of the switching device 10. In this invention the switching device 10 is a metal oxide semiconductor (MOS) transistor. The drain 12 of the MOS transistor 10 is connected to the primary program control line 20 and the gate 16 of the MOS transistor 10 is connected to the word control line 25.

The side of the pinned layer 34 opposite the side connected to the MOS transistor 10 is connected to the secondary program control line 40. The structure allows current 42 to pass through the pinned ferromagnetic layer 34 to program or write digital data to the magnetic tunnel junction device 30. The direction of the current 42 determining whether the magnetization 33a or 33b of the free ferromagnetic layer 32 is parallel or anti-parallel to the magnetization 31 of the pinned ferromagnetic layer 34.

The MRAM cell of this invention is operated for writing or programming by first activating the word line 25 to turn on the MOS transistor 10. The bit line 45 is disconnected such that the free ferromagnetic layer 32 is floating. A current source has its source terminal connected to the primary program control line 20 and its return terminal connected to the secondary program control line 40. The current source is activated to provide a write current 42 through the pinned ferromagnetic layer 34. The direction of the write current 42 being determined by the value of the digital data being written to the MRAM cell. The write current 42 then determining the orientation 33a or 33b of the magnetization of the free ferromagnetic layer 32.

The read process of the MRAM cell begins by setting the primary program control line 20 and secondary program control line 40 to the ground reference voltage. The word line 25 is activated to turn on the MOS transistor 10. A sense current is forced through the free ferromagnetic layer, the tunneling barrier 36 and the pinned ferromagnetic layer 34 to the primary program control line 20 and the secondary program control line 40. The voltage developed across the magnetic tunnel junction device 30 is sensed to determine the digital data retained within the magnetic tunnel junction device 30.

Figure 1B:
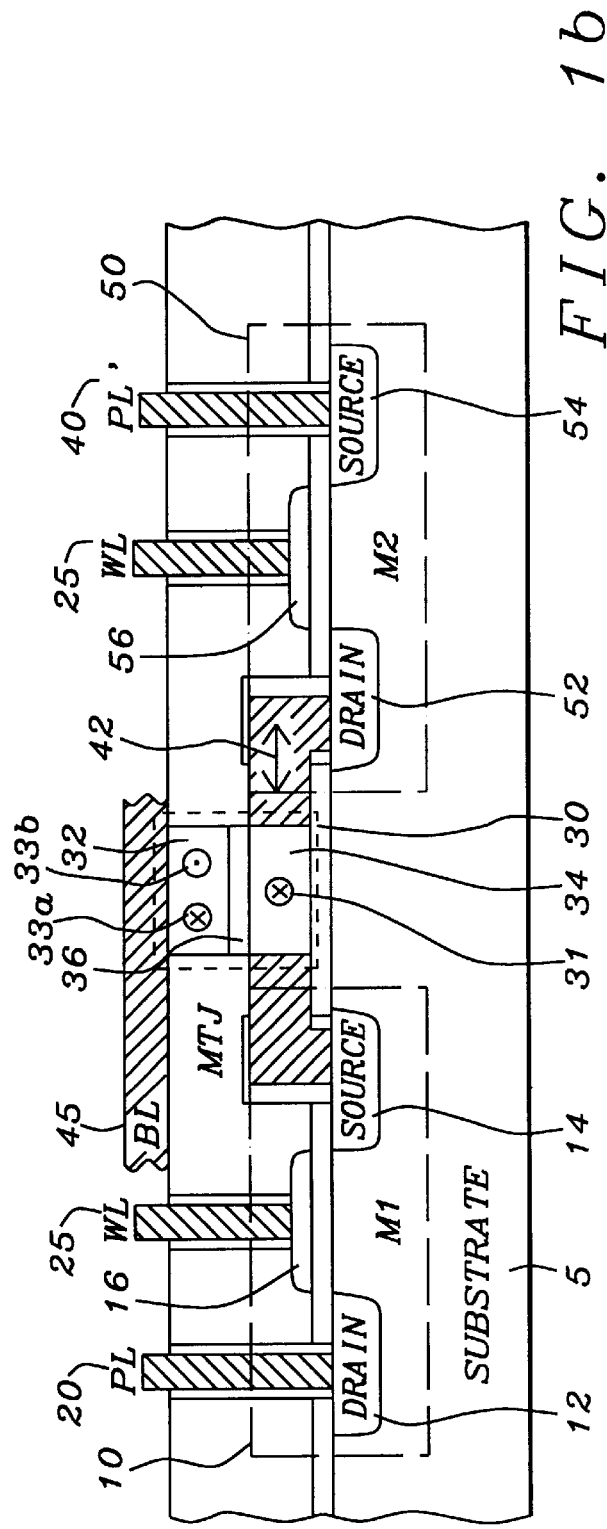

The second embodiment of the MRAM cell of this invention, as shown in FIG. 1b, is essentially equivalent to the MRAM cell of FIG. 1a, except that a second MOS transistor 50 is placed between the magnetic tunnel junction device 30 and the secondary program control line 40. The drain 52 of the second MOS transistor 50 is connected to the side of the pinned ferromagnetic layer 34 opposite the side connected to the first MOS transistor 10. The source 54 of the second MOS transistor 50 is connected to the secondary program control line 40 and the gate 56 of the second MOS transistor 50 is connected to the word control line 25.

The MRAM cell of this invention is operated for writing or programming by first activating the word line 25 to turn on the first MOS transistor 10 and the second MOS transistor 50. The bit line 45 is disconnected such that the free ferromagnetic layer 32 is floating. A current source has its source terminal connected to the primary program control line 20 and its return terminal connected to the secondary program control line 40. The current source is activated to provide a write current 42 through the first MOS transistor 10 into the pinned ferromagnetic layer 34 and from the pinned ferromagnetic layer 34 to the second MOS transistor 50, and into the secondary program control line 40. The direction of the write current 42 being determined by the value of the digital data being written to the MRAM cell. The write current 42 then determining the orientation 33a or 33b of the field within the free ferromagnetic layer 32.

In the read operation, the primary program control line 20 and secondary program control line 40 are set to the ground reference voltage. The word line 25 is activated to turn on the first MOS transistor 10 and the second MOS transistor 50. A sense current is forced through the free ferromagnetic layer 32, the tunneling barrier 36 and the pinned ferromagnetic layer 34 to the primary program control line 20 and the secondary program control line 40. The voltage developed across the magnetic tunnel junction device 30 is sensed to determine the digital data retained within the magnetic tunnel junction device 30.

Figure 2:
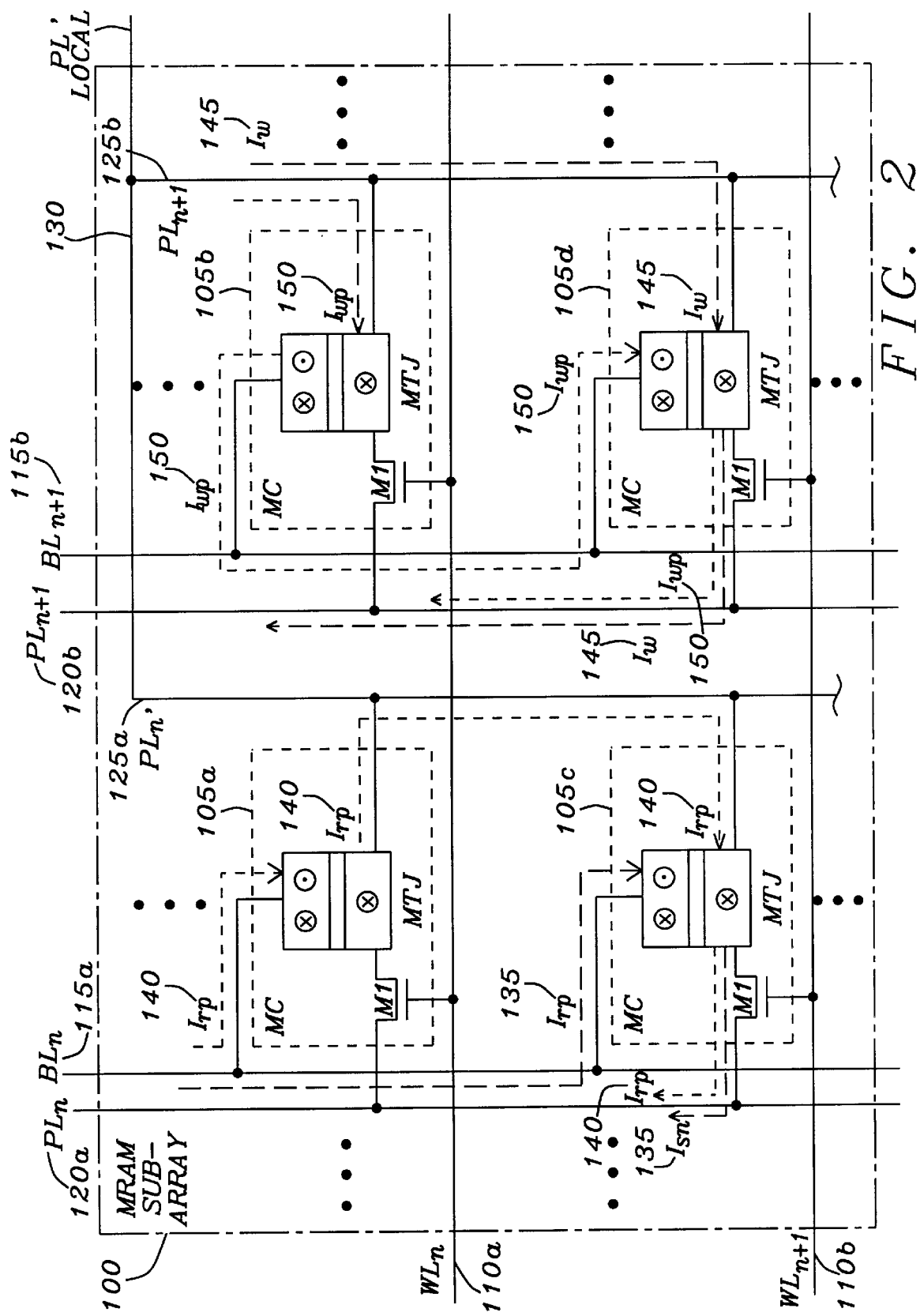
FIG. 2 is a schematic diagram of a sub-array of the first embodiment of MRAM cells of this invention.

Refer now to FIG. 2 for a discussion of a grouping of MRAM cells arranged as a sub-array 100. The MRAM cells 105a, 105b, 105c, and 105d are the cells as described in FIG. 1a and are arranged in sets of columns and sets of rows Each row of the sub-array 100 of the MRAM cells 105a, 105b, 105c, and 105d is connected to a word control line 110a and 110b at the gate of the MMOS transistor M1. Each column of the sub-array 100 of the MRAM cells 105a, 105b, 105c, and 105d is connected to one of the bit lines 115a and 115b at the free ferromagnetic layer of the magnetic tunnel junction (MTJ). Further, each column of the sub-array 100 of the MRAM cells 105a, 105b, 105c, and 105d is connected to one of the primary program control lines 120a and 120b at the drain of the MOS transistor M1. Additionally, each column of the sub-array 100 of the MRAM cells 105a, 105b, 105c, and 105d is connected to one of the secondary program control lines 125a and 125b at the second side of the pinned ferromagnetic layer opposite the MOS transistor M1. All of the secondary program control lines 125a and 125b are connected to form the local secondary program control line 130.

The write operation for a cell within the sub-array 100 of the MRAM cells 105a, 105b, 105c, and 105d is fundamentally as described in FIG. 1a. The word line 110a or 110b to turn on the MOS transistor M1 of one of the MRAM cells 105a, 105b, 105c, and 105d that is to be written or programmed. The bit lines 115a and 115b are disconnected such that the free ferromagnetic layer of the MRAM cells 105a, 105b, 105c, and 105d are floating. A current source has its source terminal connected to the primary program control line 120a or 120b of the MRAM cells 105a, 105b, 105c, and 105d that is to be written and its return terminal connected to the local program control line 130 and thus to the its secondary program control lines 125a and 125b. The current source is activated to provide a write current 145 through the pinned ferromagnetic layer of the selected MRAM cell (105d for example). The direction of the write current 145 being determined by the value of the digital data being written to the MRAM cell. The write current 145 then determining the magnetization within the free ferromagnetic layer A parasitic write current 150 flows from the secondary program control line 125b through the pinned ferromagnetic layer, the tunneling barrier, and the free ferromagnetic layer of the non-selected MRAM cells 125b connected to the secondary program control line 125b to the common bit line 115b. The parasitic write current 150 then flows in the common bit line 115b through selected MRAM cell 105d to the primary program control line 120b, where the parasitic write current 150 is combined with the write current 145. In an array where multiple MRAM cells 105a, 105b, 105c, and 105d have common primary control lines 120a and 120b, common secondary control lines 125a and 125b, and common bit lines 115a and 115b, the parasitic write current for all the common MRAM cells 105b and 105d is added and may effect the magnetization within the free ferromagnetic layer of the selected MRAM cell 105d.

The read operation is as described above in FIG. 1a. For example, the reading of the MRAM cell 105c has the bit line 115a connected to a current source (not shown). The current source is activated to provide the sense current $I_{sn}$ 135 to the bit line 115a. The word line 110b containing the memory cell to be read is activated to turn on the transistor M1 of the memory cell 105c. The primary program line 120a is forced to the ground reference voltage and the sense current $I_{sn}$ 135 passes through the desired magnetic tunnel junction MTJ of the memory cell 105c. The voltage developed across the magnetic tunnel junction MTJ is sensed to determine the digital data contents of the memory cell 105c. During the read operation, the secondary program control lines 125a and 125b are connected to be floating to prevent excess current from passing through the magnetic tunnel junction MTJ.

In an array of sub arrays 100 of MRAM cells, the local secondary program control lines 130 are connected to a global program control line (to be discussed hereinafter). During a read operation, a switch disconnects the local program control line 130 from the global program control line and the secondary program control lines 125a and 125b are floating. In the example having the MRAM cell 105c is being read, a parasitic read current $I_{rp}$ 140 passes through the other magnetic tunnel junctions MTJ of the non-selected rows of MRAM cells 105a and 105b. This parasitic read current $I_{rp}$ 140 for each of the non-selected cells 105a passes through the pinned ferromagnetic layer of the magnetic tunnel junction of the selected cell 105c and if sufficiently large, will change or corrupt the contents of the digital data retained within the MRAM cell 105c. The parasitic read current $i_{rp}$ 140 for the sub-array 100 is determined by the equation $$I_{rptot} = NI_s$$

where:

$I_{rptot}$ is the total parasitic current passing through the selected MRAM cell 105c.

N is the number of MRAM cells 105a, 105b, 105c, and 105d.

The total parasitic current $I_{rptot}$ must be less than the current necessary to set to the orientation of the magnetization of the free ferromagnetic layer of the magnetic tunnel junction MTJ of the selected MRAM cell 105c. This constraint determines the number of MRAM cells 105a, 105b, 105c, and 105d that maybe placed within a sub-array and connected to the secondary program control lines 125a and 125b. The number N of MRAM cells 105a, 105b, 105c, and 105d is determined by the equation:

$$N < \frac{I_w}{\alpha I_{rptot}}$$

where:

$I_w$ is the current necessary to write digital data to the selected MRAM cell 105c.

α is a safety margin to insure that the selected MRAM cell 105c is not rewritten and to allow the voltage of the bit line 115a resulting from the read sense current $I_{sn}$ 130 to be correctly sensed.

Figure 3:
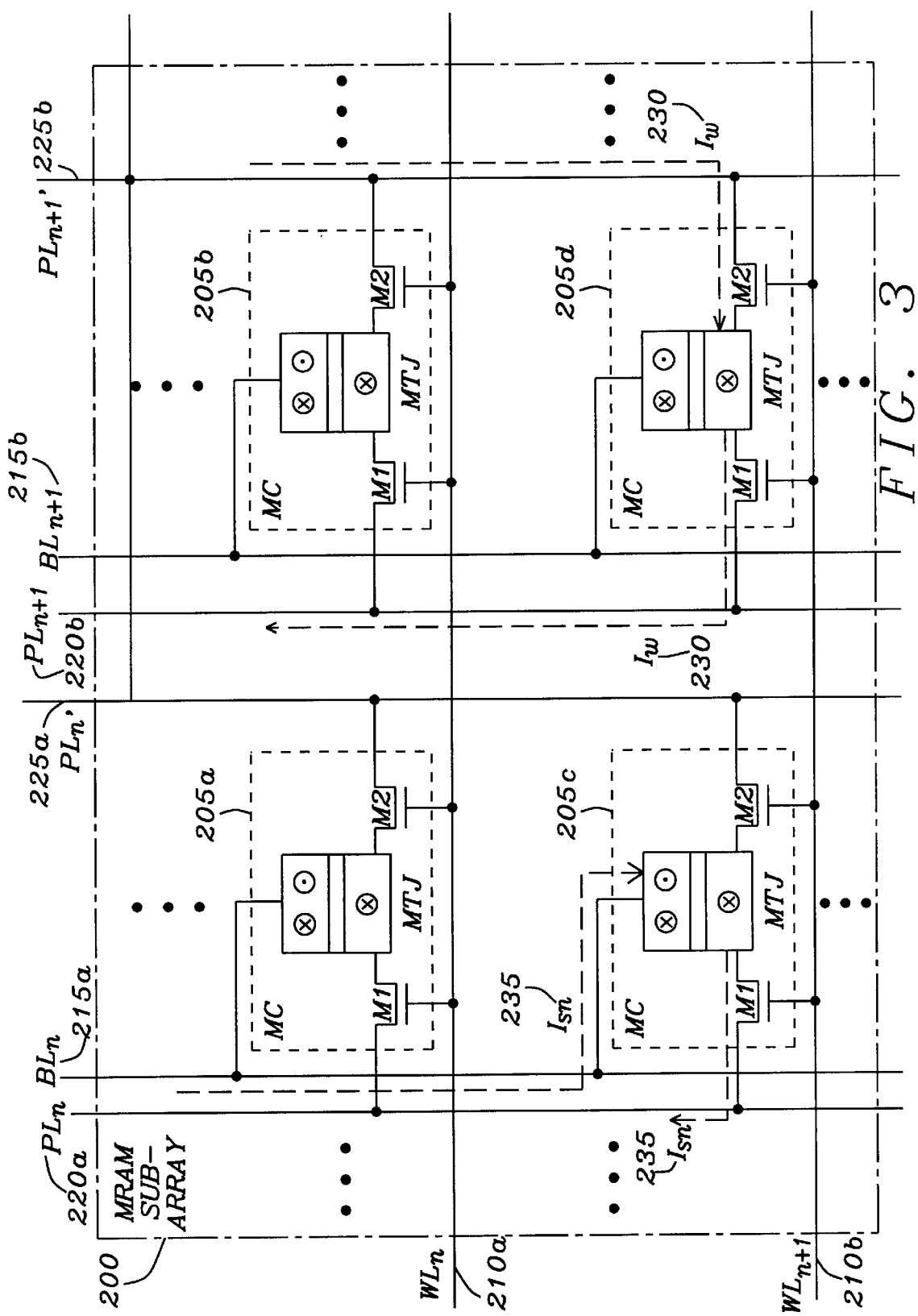
FIG. 3 is a schematic diagram of a sub-array of the second embodiment of MRAM cells of this invention.

The addition of the second MOS transistor 50 as shown in FIG. 1b eliminates or minimizes the effects of the parasitic read current $I_{rp}$ and the parasitic write current $I_{wp}$. Refer now to FIG. 3 for a discussion of the sub-array 200 of MRAM cells 205a, 205b, 205c, and 205d. The MRAM cells 205a, 205b, 205c, and 205d are the cells as described in FIG. 1b and are arranged in sets of columns and sets of rows. Each row of the sub-array 200 of the MRAM cells 205a, 205b, 205c, and 205d is connected to a word control line 210a and 210b at the gate of the MOS transistor M1 and the gate of the MOS transistor M2. Each column of the sub-array 200 of the MRAM cells 205a, 205b, 205c, and 205d is connected to one of the bit lines 215a and 215b at the free ferromagnetic layer of the magnetic tunnel junction (MTJ). Further, each column of the sub-array 200 of the MRAM cells 205a, 205b, 205c, and 205d is connected to one of the primary program control lines 220a and 220b at the drain of the MOS transistor M1. Additionally, each column of the sub-array 200 of the MRAM cells 205a, 205b, 205c, and 205d is connected to one of the secondary program control lines 225a and 225b at the drain of the MOS transistor M2.

The write operation for a cell within the sub-array 200 of the MRAM cells 205a, 205b, 205c, and 205d is fundamentally as described in FIG. 1b. For example if the MRAM cell 205d is to be programmed with new digital data, The primary program line 220b is connected to a current source (not shown), which is activated to provide the write current $I_w$ 230. The write control line 210b is activated to turn on the MOS transistors M1 and M2 of the MRAM cell 205d. The secondary programmed control line 225b is connected to act as a return path for the write current $I_w$ 230. The write current $I_w$ 230 in the pinned layer creates a magnetic field in the free layer of the MRAM cell 205d to set the orientation of the magnetization within the free ferromagnetic layer to write the digital data.

Since each of the MOS transistors on the non-selected word lines 210a are not turned on. There are only minimal parasitic write currents. This prevents any concerns with the control of these parasitic currents. The secondary program control lines maybe joined to form a local program control line that is switched to a global program control line, but the parasitic currents are sufficiently small to eliminate this as a requirement.

The read operation is as described above in FIG. 1b. For example, the reading of the MRAM cell 205c has the bit line 215a connected to a current source (not shown). The current source is activated to provide the sense current $I_{sn}$ 235 to the bit line 215a. The word line 210b containing the memory cell to be read (205c) is activated to turn on the MOS transistors M1 and M2 of the memory cell 205c. The primary program line 220a and the secondary program control line 225a are forced to the ground reference voltage and the sense current $I_{sn}$ 235 passes through the desired magnetic tunnel junction MTJ of the memory cell 205c. The voltage developed across the magnetic tunnel junction MTJ is sensed to determine the digital data contents of the memory cell 205c.

As described for the write operation, the non selected word lines 210a do not turn on the MOS transistors M1 and M2 of the MRAM cells connected to the non-selected word lines 210a. This prevents the flow of the parasitic currents to the secondary program control lines as described above. The number of MRAM cells 205a, 205b, 205c, and 205d form the MRAM sub-array 200 is now more dependent on the capacitance of the connecting control lines (word line, bit line, and primary and secondary program control lines).

Figure 4:
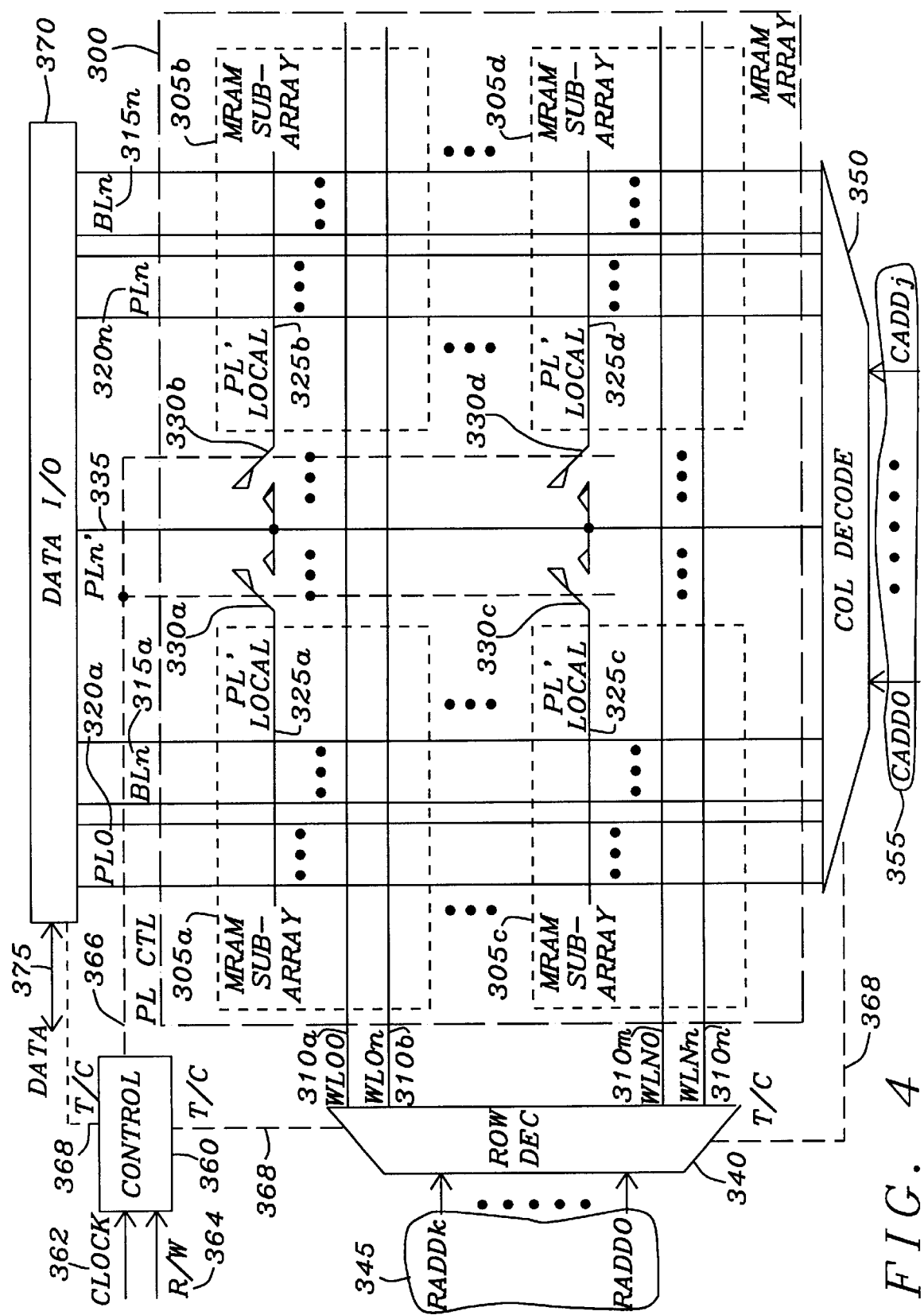
FIG. 4 is a schematic diagram of an array of MRAM cells of this invention.

The overall structure of a magnetic memory array is shown in FIG. 4. The sub-arrays 305a, 305b, 305c, and 305d are configured to form the array 300. The digital data 375 that is to be written to or read from the memory array 300 is transmitted to the data input/output circuit 370. The row addresses 345 are applied to the row decoder 340 and the column addresses 355 are applied to the column decoder 350. The clock signal 362 and the read/write signal 364 are inputs to the timing and control circuit 360. The timing and control circuit may receive other control lines necessary for the timing and operation of the magnetic memory. The timing and control circuit 360 generates the necessary timing and control signals 368 that are transferred to the row decoder 340 and the column decoder 350. The row address 345 is decoded and according the appropriate timing and control activates the necessary word line 310a, . . . , 310n. Similarly, the column decoder 350 decodes the column address 355 to select the appropriate bit line 315a, . . . , 315n, appropriate primary program control line 320a, . . . , 320n, and the appropriate secondary global program control line 335. While the diagram only shows one secondary global control line 335, it is keeping with the function of this invention that the array has multiple secondary global program control lines.

The switching devices 330a, . . . , 330d (MOS transistors in the preferred embodiment) are appropriately activated to connect the secondary global program control lines to the local program control lines. The control of the activation of the switching devices 330a, . . . , 330d is provided by the program control signal 366 from the timing and control circuit 360.

The data input/output circuit 370 contains the necessary current sources that are appropriately applied as described above for the writing and read in of a selected sub-array. The data input/output circuit 370 sets the current sources to provide the write current to the primary program control lines 320a, . . . , 320n and from the global secondary control lines 335 for writing a selected MRAM cell. The appropriate switching device bit lines 330a, . . . , 330n containing the selected MRAM cells is activated by the program control signal such that the correct local program control line bit lines 325a, . . . , 325n is connected to provide the returned write current $I_s$. During the writing the bit lines 315a, . . . , 315n are set to be floating or alternately to the voltage level of the primary program control lines 320a, . . . , 320n.

In the read operation, the data input/output circuit 370 sets the current sources such that the sense current $I_s$ is applied to the bit lines 315a, . . . , 315n. The primary program control line bit lines 320a, . . . , 320n are connected to the ground reference voltage to receive the sense current $I_s$ such that the voltage across the selected MRAM cell can be detected and the digital data determined and transferred to the output data 375.

The segmenting of the secondary program control line as shown allows the elimination or minimization of the any parasitic currents within the MRAM memory array. This insures the quality of the data as retained and recovered from the memory array is not disturbed by during the reading and writing process.

While this invention has been particularly shown and described with reference to the preferred embodiments thereof, it will be understood by those skilled in the art that various changes in form and details may be made without departing from the spirit and scope of the invention.

The invention claimed is:

1. A magnetic random access memory (MRAM) cell comprising:
   a magnetic tunnel junction; and
   a primary switching device connected to provide a write current to a pinned ferromagnetic layer of said magnetic tunnel junction during a writing of digital data to said MRAM cell and connected to a word control line to selectively provide said write current when said word control line is at a select state and to impede said write current when said word control line is at a deselect state, said primary switching device being connected to a primary program control line to provide the write current to said pinned ferromagnetic layer, a direction of flow of said write current determining a magnetic field of said pinned ferromagnetic layer.

2. The MRAM cell of claim 1 wherein said magnetic tunnel junction has a free ferromagnetic layer connected to receive a sense current from a bit line, said sense current determining a data value as stored in said magnetic tunnel junction.

3. The MRAM cell of claim 2 wherein the bit line is disconnected to be floating during said writing of the digital data.

4. The MRAM cell of claim 2 wherein the bit line is set to a voltage level equal to the voltage level of said primary program control line during said writing of the digital data.

5. The MRAM cell of claim 1 wherein said pinned ferromagnetic layer is connected to said primary switching device at a first side and connected to a secondary program control line at a second side such that the write current flows between the first side and second side.

6. The MRAM cell of claim 1 wherein said pinned ferromagnetic layer is connected to said primary switching device at a first side, and wherein said MRAM cell further comprises a second switching device connected to a secondary program control line at a second side such that the write current flows between the first side and second side, said second switching device being connected to the word control line to selectively activate said secondary switching device to allow said write current to flow between the primary program control line and the secondary program control line through said pinned ferromagnetic layer.

7. A memory structure comprising:
   at least one local program control line to provide a program current for writing a digital data bit within said memory structure;
   a plurality of word control lines to provide a control signal for accessing said memory structure;
   a plurality of magnetic random access memory (MRAM) cells having a first set of said plurality of MRAM cells connected to one local program control line and a second set of said plurality of MRAM cells connected to word control line, each MRAM cell comprising:
      a magnetic tunnel junction; and
      a primary switching device connected one of a plurality of primary program control lines to provide the write current through a pinned ferromagnetic layer of said magnetic tunnel junction to one the local program control lines and connected to one of the word control lines to selectively provide said write current when said word control line is at a select state and to impede said write current when said word control line is at a deselect state, a direction of flow of said write current determining a magnetic field of said pinned ferromagnetic layer.

8. The memory structure of claim 7 further comprising at least one bit line such that each bit line is connected to the first set of said MRAM cells, wherein said magnetic tunnel junction of each MRAM cell has a free ferromagnetic layer connected to receive a sense current from one of said bit lines, said sense current determining a data value as stored in said magnetic tunnel junction.

9. The memory structure of claim 8 wherein the bit line is disconnected to be floating during said writing of the digital data.

10. The memory structure of claim 8 wherein the bit line is set to a voltage level equal to the voltage level of said primary program control line during said writing of the digital data.

11. The memory structure of claim 7 wherein said pinned ferromagnetic layer of each MRAM is connected to said primary switching device at a first side and connected to the local program control line at a second side such that the write current flows between the first side and second side.

12. The memory structure of claim 7 wherein said pinned ferromagnetic layer is connected to said primary switching device at a first side, and wherein said MRAM cell further comprises a second switching device connected to the local program control line at a second side such that the write current flows between the first side and second side, said second switching device being connected to the word control line to selectively activate said secondary switching device to allow said write current to flow between the primary program control line and the secondary program control line through said pinned ferromagnetic layer.

13. The memory structure of claim 7 further comprising a global switching device to selectively connect the at least one local program control line to a global program control line such that write current is directed to those MRAM cells being written.

14. A memory array comprising:
   a plurality of word control lines to provide a control signal for accessing said memory structure;
   a plurality of memory structures, each memory structure comprising
      at least one local program control line to provide a program current for writing a digital data bit within said memory structure;
      a plurality of magnetic random access memory (MRAM) cells having a first set of said plurality of MRAM cells connected to one local program control line and a second set of said plurality of MRAM cells connected to word control line, each MRAM cell comprising:
         a magnetic tunnel junction; and
         a primary switching device connected one of a plurality of primary program control lines to provide the write current through a pinned ferromagnetic layer of said magnetic tunnel junction to one the local program control lines and connected to one of the word control lines to selectively provide said write current when said word control line is at a select state and to impede said write current when said word control line is at a deselect state, a direction of flow of said write current determining a magnetic field of said pinned ferromagnetic layer.

15. The memory array of claim 14 further comprising at least one bit line such that each bit line is connected to the first set of said MRAM cells, wherein said magnetic tunnel junction of each MRAM cell has a free ferromagnetic layer connected to receive a sense current from one of said bit lines, said sense current determining a data value as stored in said magnetic tunnel junction.

16. The memory array of claim 15 wherein the bit line is disconnected to be floating during said writing of the digital data.

17. The memory array of claim 15 wherein the bit line is set to a voltage level equal to the voltage level of said primary program control line during said writing of the digital data.

18. The memory array of claim 14 wherein said pinned ferromagnetic layer of each MRAM is connected to said primary switching device at a first side and connected to the local program control line at a second side such that the write current flows between the first side and second side.

19. The memory array of claim 14 wherein said pinned ferromagnetic layer is connected to said primary switching device at a first side, and wherein said MRAM cell further comprises a second switching device connected to the local program control line at a second side such that the write current flows between the first side and second side, said second switching device being connected to the word control line to selectively activate said secondary switching device to allow said write current to flow between the primary program control line and the secondary program control line through said pinned ferromagnetic layer.

20. The memory array of claim 14 further comprising:
   at least one global program control line to provide the write current to those MRAM cells being written; and
   each memory structure further comprising at least one global switching device, each global switching device selectively connecting the local program control line to one global program control line to direct said write current to one MRAM cell being written.

21. A method for operating a magnetic random access memory (MRAM) cell said comprising:
   a magnetic tunnel junction; and
   a primary switching device connected to a pinned ferromagnetic layer of said magnetic tunnel junction, to a write current source, said write current source providing a write current for transferring digital data to said magnetic tunneling, and connected to a word control line for selectively transferring said write current to said magnetic tunnel junction;
said method comprising the steps of:
   writing digital data to said MRAM cell by the steps of:
      activating said write current source to a direction of said write current to a direction representing said digital data; and
      activating said primary switching device by setting said word control line to a select state to permit said write current to flow to said MRAM cell,
   when said MRAM cells has received and retained said digital data, deactivating said primary switching device by setting said word control line to deselect state, said primary switching device being connected to a primary program control line to provide the write current to a pinned ferromagnetic layer of said magnetic tunnel junction, a direction of flow of said write current determining a magnetic field of said pinned ferromagnetic layer.

22. The method of claim 21 wherein said magnetic tunnel junction has a free ferromagnetic layer connected to interact with a bit line, and said method further comprising the step of:
   reading said MRAM said MRAM cell by the steps of:
      activating a sense current source to place said sense current on said bit line; and
      determining from said sense current the digital data value as stored in said magnetic tunnel junction.

23. The method of claim 22 wherein the step of writing digital data to said MRAM cell further comprises the step of disconnecting said bit line such that said bit line is floating during said writing of the digital data.

24. The method of claim 22 wherein the step of writing digital data to said MRAM cell further comprises the step of setting said bit line to a voltage level equal to the voltage level of said primary program control line during said writing of the digital data.

25. The method of claim 21 wherein said pinned ferromagnetic layer is connected to said primary switching device at a first side of said ferromagnetic layer and connected to a secondary program control line at a second side such that the write current flows between the first side and second side.

26. The method of claim 21
   wherein said pinned ferromagnetic layer is connected to said primary switching device at a first side of said ferromagnetic layer;
   wherein said MRAM cell further comprises a second switching device connected to a second side of said ferromagnetic layer, a secondary program control line, and the word control line;
   and wherein the step of writing digital data to said MRAM cell further comprises the steps of:
      activating said secondary switching device by setting to said word control line to a select state to permit said write current to flow between the primary program control line and the secondary program control line through said pinned ferromagnetic layer;
      when said MRAM cells has received and retained said digital data, deactivating said secondary switching device by setting said word control line to deselect state.

* * * * *